(12) United States Patent
Lindström et al.

(10) Patent No.: US 6,812,152 B2
(45) Date of Patent: Nov. 2, 2004

(54) METHOD TO OBTAIN CONTAMINATION FREE LASER MIRRORS AND PASSIVATION OF THESE

(75) Inventors: L. Karsten V. Lindström, Hägersten (SE); N. Peter Blixt, Hägersten (SE); Svante H. Söderholm, Västerås (SE); Anand Srinivasan, Huddinge (SE); Carl-Fredrik Carlström, Farsta (SE)

(73) Assignee: Comlase AB, Hagersten (SE)

( * ) Notice: Subject to any disclaimer, the term of this patent is extended or adjusted under 35 U.S.C. 154(b) by 0 days.

(21) Appl. No.: 09/924,605

(22) Filed: Aug. 9, 2001

(65) Prior Publication Data

US 2003/0029836 A1 Feb. 13, 2003

(51) Int. Cl.[7] .............................................. H01L 21/302
(52) U.S. Cl. ...................... 438/706; 438/710; 438/712; 438/720; 216/65; 216/67
(58) Field of Search ................................ 438/706, 710, 438/712, 720, 33, 37, 42; 216/65, 67, 72

(56) References Cited

U.S. PATENT DOCUMENTS 5,668,049 A * 9/1997 Chakrabarti et al. .......... 438/33
5,669,049 A * 9/1997 Palumbo et al. ............. 399/265
5,780,120 A * 7/1998 Belouet et al. ............. 427/554
6,204,084 B1 * 3/2001 Sugiura et al. ............... 438/46
6,261,962 B1 * 7/2001 Bhardwaj et al. ........... 438/702
6,323,052 B1 * 11/2001 Horie et al. .................. 438/46
6,379,985 B1 * 4/2002 Cervantes et al. ............ 438/33

* cited by examiner

Primary Examiner—Lan Vinh
(74) Attorney, Agent, or Firm—Paul Davis; Heller Ehrman White & McAuliffe

(57) ABSTRACT

A method to obtain contamination free surfaces of a material chosen from the group comprising GaAs, GaAlAs, InGaAs, InGaAsP and InGaAs at crystal mirror facets for GaAs based laser cavities. The crystal mirrors facets are cleaved out exposed to an ambient atmosphere containing a material from the group comprising air, dry air, or dry nitrogen ambients. Any oxides and other foreign contaminants obtained during the ambient atmosphere exposure of the mirror facets are removed by dry etching in vacuum. Thereafter, a native nitride layer is grown on the mirror facets by treating them with nitrogen.

25 Claims, 4 Drawing Sheets

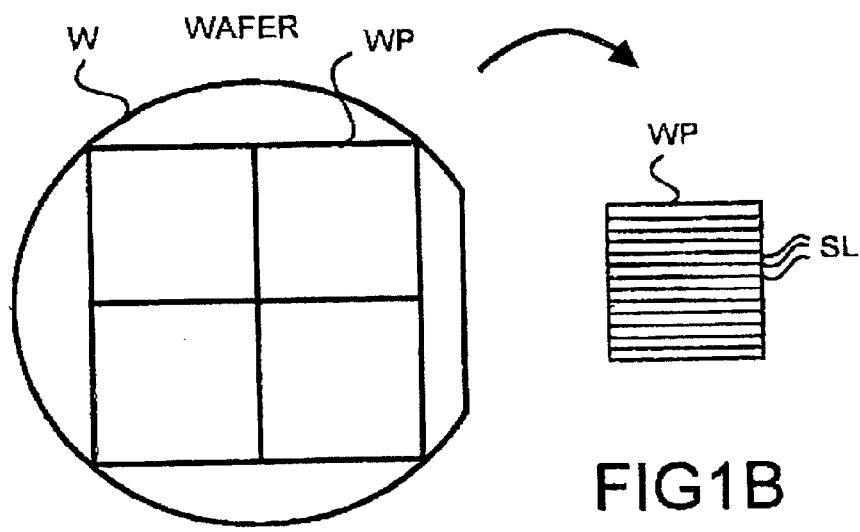
FIG 1A
FIG1B
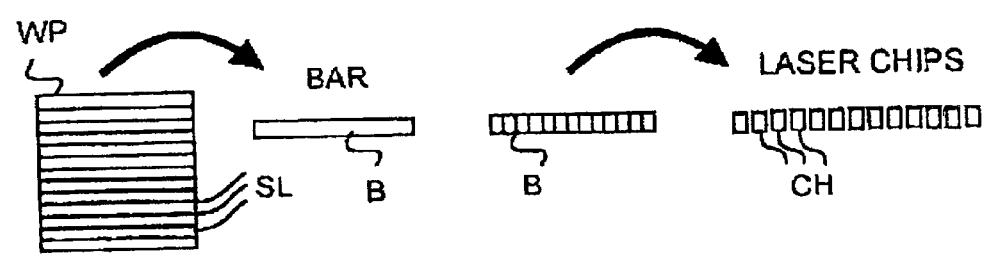
FIG1C
FIG1D

METHOD TO OBTAIN CONTAMINATION FREE LASER MIRRORS AND PASSIVATION OF THESE

The present invention relates to a method to obtain contamination free laser mirrors and passivation using dry etching and deposition.

BACKGROUND

One of the key factors that dictates manufacturing of reliable 980 nm pump lasers is the quality of the laser facet. Passivation is a common technique in the semiconductor business. All semiconductors need a thin film as a barrier against impurities. Impurities will act as defects and change the electrical and optical behavior or impair the crystalline structure in general, by oxidization for example. For silicon chips the passivation is performed automatically by exposing the chip to oxygen in the atmosphere. The oxygen will form a protective $SiO_2$-layer. The oxidization of GaAs based lasers is highly detrimental for the optical performance, therefore another materials to be applied on the laser facet.

Degradation of laser facets by light absorption is known to lead to sudden failure by catastrophic optical damage (COD) and has been one of the major causes for device failure. This is a serious concern especially for high power operation (usually beyond 150 mW). The onset of COD is attributed to light absorption at the output facet and subsequent non-radiative recombination via surface states. The light absorption and non-radiative recombination increases the temperature and that results in band-gap reduction. This process acts as a positive feedback until the facet temperatures become very high and COD occurs.

Therefore, to suppress this undesirable effect, at least one of the two main factors, light absorption and surface recombination, has to be minimized. The surface recombination is promoted by an increase in either surface-state density and/or number of impurities (traps) at the surface. The light absorption can also be minimized by a so-called window comprising a thin layer of an inactive material between the facet and the active layer lying behind the facet. In this case the bandgap of the window structure should be higher than the bandgap of the active layer. The minimization of these can be accomplished by suitable surface passivation coatings or treatments.

RELATED ART

U.S. Pat. No. 4,448,633 discloses a method to passivate type III-V compound semiconductor surfaces by exposure to a low-pressure nitrogen plasma. The III element forms III element-nitride. This process is referred to as nitridation. The resultant articles have an III element-nitride surface layer, which protects the articles from environmental degradation while reducing the surface state density and permitting inversion of the surface layer. The nitridation is performed in two steps. The first occurs at low temperatures (400–500° C.) to prevent decomposition of the surface by loss of V element. Exposure to nitrogen plasma with a pressure of 0.01–10 Torr results in an initial III-nitride layer having a thickness of about 20–100 Å. The second step is performed at an elevated temperature (500–700° C.) under the same plasma conditions. Here, the nitridation proceeds at a faster rate resulting in a thicker nitrided layer (200–1000 Å). Under the present conditions, if the plasma pressure is in tie range 0.01 to about 0.5 Torr the resulting III-coating is polycrystalline, and is single-crystalline when the pressure is in the range 1 to 10 Torr.

U.S. Pat. No. 5,780,120 describes a method of preparing facets of lasers based on III-V compounds. The method comprises of the following operations:

1) The facets of the laser are cut.
2) The facets of the laser are placed in an enclosure in which there obtains a pressure of about 10–7 mbar to about 10–8 mbar, and they are subjected to a step of cleaning by irradiation with a pulsed laser.
3) The same pulsed laser is used to ablate a target so as to subject the exposed facets to a passivation operation, that is 2–20 Å of Si or GaN is deposited.

The deposition can be performed by pulsed laser ablation of a liquid gallium target in a nitrogen atmosphere with Electron Cyclotron resonance (ECR) plasma. Deposition of an additional film such as Diamond Like Carbon (DLC), silicon carbide SiC, or silicon nitride $Si_3N_3$, may be deposited using the same pulsed laser. These coatings are transparent at the wavelength of the laser and are resistant to oxidation. A cleaning step prior to the passivation stage may be performed in an atmosphere of chlorine or bromine, using a pulsed excimer laser. This document suggests that an additional coating is not necessary if GaN is deposited instead of Si. This also suggests that III-N layers are oxygen-proof.

U.S. Pat. No. 5,834,379 describes a process for synthesizing wide band gap materials, specifically GaN, employs plasma-assisted thermal nitridation with $NH_3$ to convert GaAs to GaN. This method can be employed for forming layers of substantial thickness (on the order of 1 micron) of GaN on a GaAs substrate, Plasma-assisted nitridation using $NH_3$ results in formation of predominantly cubic GaN. The objective of this document is to make sufficiently thick GaN layers and is not directly concerned with laser facet passivation. However, the basic principle relies on nitridation using a plasma source. Such approaches are being used in growth of GaN films.

The above patents address the concept of nitridation of III-V semiconductors using nitrogen plasma.

U.S. Pat. No. 4,331,737 describes an oxynitride film, which contains Ga and/or Al and has O/N ratio of at least 0.15. This film is obtained by relying on, for example, chemical vapour deposition (CVD) technique, The O/N ratio in the film may be varied by, for example, by varying the distance between the substrate and the substance-supply source, or by varying the proportion of an oxidising gas contained in a carrier gas. This film is used either as a surface passivation film of III-V compound semiconductors such as GaAs, or as an insulating film for active surface portions of IG-FET, or as an optical anti-reflective film.

EP0684671 describes a method, which comprises oxide reduction, hydrogen passivation and deposition of a protective coating layer. The method involves the same PECVD reactor for all steps to avoid oxygen exposure The cleaved facets (being exposed to air and thus oxidised) are loaded into the reactor. The first step uses hydrogen plasma, which both reduces the group V oxide content and passivates non-radiative recombination centres. The group III oxides are removed by ammonia plasma and the laser facets have their compositional stoichiometry condition restored and are free from contaminants. Coating is then done either by depositing SiN(x) or AlN(x). Minimum stress can also be obtained through creation of a compositional nitrogen gradient.

U.S. Pat. No. 5,668,049 discloses a method of making a GaAs-based semiconductor laser. A fully processed wafer is cleaved, typically in ambient atmosphere into laser bars. The laser bars are loaded into an evacuable deposition chamber (preferably an ECR CVD chamber) and exposed to H$_2$S plasma. The hydrogen is believed to remove native oxides, while the sulfur bonds with Ga and As, thereby lowering the surface state density. Following the exposure, the cleavage facets are coated in the chamber with a protective dielectric (for example, silicon nitride) layer. The patent claims that this method can be practiced with high through-put, and can yield lasers capable of operation at high power.

U.S. Pat. No. 5,144,634 discloses a method for passivating mirrors in the process of fabricating semiconductor laser diodes. Key steps of the method are:

(1) providing a contamination-free mirror facet, followed by (2) an in-situ application of a continuous, insulating (or low conductive) passivation layer.

This layer is formed with a material that acts as a diffusion barrier for impurities capable of reacting with the semiconductor but which does not itself react with the mirror surface. The contamination-free mirror surface is obtained by cleaving in a contamination-free environment, or by cleaving in air, followed by mirror etching, and subsequent mirror surface cleaning. The passivation layer consists of Si, Ge or Sb. A Si layer with a second layer containing Si$_3$N$_4$ is also claimed.

EP0474952 proposes another method of passivating etched mirror facets of semiconductor laser diodes for enhancing device reliability. The etched mirror facet is first subjected to a wet-etch process to substantially remove any native oxide as well as any surface layer which may have been mechanically damaged during the preceding mirror etch process. Then a passivation pre-treatment is applied whereby any residual oxygen is removed and a sub-monolayer is formed which permanently reduces the non-radiative recombination of minority carriers at the mirror facet. As pre-treatment Na$_2$S or (NH$_3$)$_2$S solutions can be used. The sulfur passivates the surface electronic states that otherwise are efficient non-recombination centers. Finally, the pre-treated mirror surface is coated with either Al$_2$O$_3$ or Si$_3$N$_4$ to avoid any environmental effect.

EP0774809 describes a method to offer a novel passivation layer that can result in improved reliability of semiconductor lasers having a laser cavity defined by laser facets. In a preferred embodiment, the passivation layer is a zinc selenide layer (e.g., 5 nm), formed on an essentially contamination-free laser facet. More generally, the passivation layer comprises at least one of Mg, Zn, Cd and Hg, and at least one of S, Se and Te. Typically, the facets are formed by cleaving in vacuum and followed by in-situ deposition of the novel passivation layer material on the facets.

U.S. Pat. No. 5,851,849 describes a process for passivating semiconductor laser structures with severe steps in the surface topography. The technique involves atomic layer deposition to produce the passivating layer which has exceptional coverage and uniformity, even in the case of trench features with trench aspect ratios as large as 5. In addition, the passivation produced by this process has excellent environmental stability, and affords protection against air born contaminant induced degradation. The coating process is carried out in a vacuum chamber. The primary feature of the process is the formation of the coating by a multiplicity of process cycles in which each cycle produces essentially an equivalent mono-layer of the passivating film. In the specific example described here the passivating film was Al$_2$O$_3$ and the reactant gases were trimethylaluminum [(CH3)$_3$Al].

The above patents mainly address different passivation methods. Typically, the processes are complicated and involve at least two steps. In some cases, special techniques and/or materials (gases, precursors etc) are used. Never the less, most of these deal with means to reduce surface state density, which is one of the important factors to suppress COD.

The article "Cleaning of GaAs Surfaces with Low-Damage Effects Using Ion-Beam Milling" by C. Lindström and P. Tihanyi, the Journal IEEE Trans. on electron Devices, Vol.ED-30, NO.6, June 1983. With ion-beam milling of the laser diode mirror surface an etch depth of 50–100 Ångström reduces the oxygen atomic percentage by 97–99% as determined by Auger depth profiling. From the same report the difference between milling with heavy Ar ions and lighter N ions were demonstrated. The important result was that N ions had no measurable detrimental influence on the laser diode performance while milling with Ar ions affected the performance negatively in the milling process. After 140 Ångström milling depth with Ar ions the power output and power conversion efficiency started to decline. However, with the introduction of N ions in the milling process no parameter changes were observed for the milling depth studied i.e. 200 Ångström.

The effect of Ar ion milling followed by N ion milling on the laser performance is also described in this article. Here, the lighter N ions remove the damage caused by the heavier Ar ions and restore the deteriorated power output performance. The conclusion from these observations is that N ion milling smoothens the mirror facet to a uniform surface similar to what is observed for surfaces mechanically cleaved in the crystal plane with a correspondingly reduced number of surface states.

The Article "Low resistance ohmic contacts an nitrogen ion bombarded InP", Ren et al, Appl. Phys. Lett. 65, 2165 (1994) reports on electrical and chemical properties of InP surfaces milled by low energy (100–300 eV) nitrogen-ions. Incorporation of nitrogen is evidenced by Secondary Ion Mass Spectroscopy (SIMS) analysis and formed poly-crystalline InN was identified by transmission electron microscopy (TEM). In the process, the native oxide on the sample surface is also removed by the milling.

The article "Nitridation of an InP (100) surface by nitrogen ion beams", Suzuki et al, Appl. Surf. Sci. 162–163, 172 (2000) describes a study of nitridation of InP (100) by low energy nitrogen ion milling. The investigators used X-ray photoelectron spectroscopy (XPS) for chemical analysis and to identify the bonding states. The ion energy ranged from 100 eV to 1 KeV. The milled surfaces show In—N, In—N—P and P—N bonding states Disappearance of In—N—P upon annealing (400° C.), suggests lower binding energies for these bonds compared to In—N. However, nitridation efficiency decreases with increasing ion energy due to sputter erosion.

The article "Characterization of damage in InP dry etched using nitrogen containing chemistries", C. F. Carlström and S. Anand, submitted to J. Vac Sci. Technol. B (March 2001) addresses etching of InP using different of processes containing nitrogen in the etch-chemistry, including nitrogen ion milling. The surfaces are extremely smooth with rms roughness<1 nm with milling at 75 eV. A thin near surface nitrogen containing layer is present. A high temperature treatment (650° C.) under phosphine, removes most of the incorporated nitrogen.

The article "Synthesis of InNxP1-x thin films by N ion implantation", Yu et al, Appl. Phys. Lett. 78, 1077 (2001)

describes implantation of nitrogen, which is carried out to form dilute InNxP1-x layers. Nitrogen ions were sequentially implanted with selected energies to form 350 nm thick layers and upon rapid thermal annealing (RTA) in flowing nitrogen (with proximity cap) the InNP alloy layers were formed.

Although, the articles above focus on different issues, the message is incorporation of nitrogen into InP during nitrogen ion milling. In addition, the results suggest that N binds to both In and P, the latter being less stable. The nitridation procedure needs to be optimized so as to have predominantly In—N in the layer. At the same time the surface must be smooth. The last work listed (Yu et al.) above offers another means to form a nitrided layer, but it is restricted in that an all-InN layer is not obtained. But, it suggests that after nitridation by ion-milling, RTA may be an additional step that may be necessary.

Nitridation of GaAs has received a great deal of attention. One of the primary concerns has been to reduce surface state density and the focus is open on Metal Insulator Semiconductor (MIS) structures. However, the methodology and/or results could also be valid for laser-facet preparation.) Below, a few selected references are summarised, with more attention to plasma assisted nitridation schemes.

The article "Nitridation of GaAs using helicon-wave excited and inductively coupled nitrogen plasma", Hara et al, J. Vac. Sci. Technol. B 16, 183 (1998) demonstrate nitridation of GaAs by special plasma treatment containing mixtures of nitrogen and argon, and/or, nitrogen and oxygen. However, pure nitrogen plasma is not commented upon. The authors show by X-ray photoelectron Spectroscopy (XPS) analysis that Ga—N bonds are formed and under certain conditions only small amounts of Ga and As sub-oxides were found. They show that nitridation suppresses oxide formation. The authors have investigated C-V characteristics of MIS devices using this procedure and found improvements. Further, photoluminescence yield is high for treated samples indicating lower surface/interface state densities. This work explicitly focuses on MIS aspects and there is no mention of the same procedure being applicable for pump lasers.

The article "Surface cleaning and nitridation of compound semiconductors using gas-decomposition reaction in Cat-CVD method", Izumi et al, Proc. Int. Vac. Congress, Aug. 31–Sep. 4, 1998, Burmingham, UK, describes the use of a gas-decomposition reaction involving Ammonia in a catalytic CVD (cat-CVD) system to for cleaning and nitriding GaAs surfaces. The authors use XPS to investigate the chemical bonding states near the surface. They claim disappearance of oxygen related peaks after their process. The proposal is that dissociation of ammonia results in hydrogen, which cleans the surface by removing the oxides, and in nitrogen, which forms Ga—N by a exchange reaction. That is, nitrogen efficiently replaces As This work mentions only MIS applications.

The articles "Nitridation of GaAs (110) using energetic N+ and N2+ ion beams", L. A. DeLouise, J. Vac. Sci. Technol. A11, 609 (1993) and "Reactive N2+ ion bombardment of GaAs (110): A method for GaN thin film growth", J. Vac. Sci. Technol. A10, 1637 (1992) use XPS to analyse nitridation of GaAs (110) upon bombardment using nitrogen ion beams (500 eV to 3 KeV). It is demonstrated that lower surface densities are obtained with nitrogen compared to Ar and is attributed to the formation of stable predominantly Ga—N bonds. Again both these articles refer to MIS-like applications and the ion energies are relatively high.

The article "$NH_3$ plasma nitridation process of 100-GaAs surface observed by XPS", Masuda et al, J. J. Appl. Phys. Part 1, 34 1075 (1995) describes XPS studies of nitridation of GaAs using ammonia plasma show formation of Ga—As—N layer. However, under certain conditions, the authors claim formation of only Ga—N layer due to desorption of As. They also report that the layer is oxidation resistant.

The article "XPS investigation of GaAs nitridation mechanism with an ECR plasma source", Sauvage-Simkin et al, Phys. Stat. Solidi A176, 671 (1999) describes formation of beta-GaN in GaAs samples exposed to nitrogen ECR plasma from XPS studies. An amorphous layer formation is evidenced, which could favour nitrogen incorporation but should be controlled to stabilize Ga—N bonds.

The article "III-V surface plasma nitridation: A challenge for III-V nitride epigrowth", Losurdo et al, J. Vac. Sci. Technol. A17, 2194 (1999) describes the increased efficiency of nitridation in the presence of hydrogen. It is proposed that hydrogen enhances desorption of group V elements.

The article "Nanometer scale studies of nitride/arsenide heterostructures produced by nitrogen plasma exposure of GaAs", Goldman et al, J. Electronic Mat. 26, 1342 (1997) describes the use of a sophisticated tool, scanning tunnelling microscope (STM), to investigate plasma nitridation of GaAs. The authors find that the nitrided layer is not a continuous film, as also found in some other works reported above. Instead it is composed of defects (As—N) and clusters (GaN with dilute As). These results show that defects that could be detrimental to device performance can also be formed. However, if appropriate nitridation conditions and possible annealing steps are used, the defects can be minimized.

The article "Surface passivation of GaAs by ultra-thin cubic GaN layer", Anantathasaran et al, Appl. Surf. Sci. 159–160, 456 (2000) describes the use of a nitrogen plasma to form a thin cubic GaN layer and use XPS and RHEED to analyse the samples. All these processing were performed under Ultra High Vacuum (UHV) conditions. The PL measurements show an order of magnitude increase in intensity compared to as-grown samples indicating good passivation properties of the nitrided layer.

The main import from the literature is that nitridation of GaAs is possible using nitrogen plasma. Some articles above have also addressed nitridation by nitrogen-ion bombardment. Most reported works refer to MIS structures for motivation and no explicit reference to pump-laser facet passivation by nitridation is mentioned. Some reports also show that the formed nitrided layer is non-uniform and could require some additional processing steps such as annealing.

Two articles describe passivation of laser facets.

The article "Reliability improvement of 980 nm laser diodes with a new facet passivation process", Horie et al, IEEE Jour. of selected topics in quantum electronics 5, 832 (1999) demonstrates improved laser performance with a three step facet preparation. The laser bars are cleaved in air, thus increasing the yield. However, the facet preparation procedure involves three steps accomplished under vacuum conditions, making it somewhat complex. The procedure itself involves low-energy Ar-ion milling, followed by a-Si layer deposition and then finally an AlOx coating layer deposition. The problem here is that after Ar-milling, the surface cannot be exposed to ambient air. Nothing is mentioned about nitrogen milling.

The article "A highly reliable GaInAs—GaInP 0.98 μm window laser", Hashimoto et al, IEEE J of quantum electronics 36, 971 (2000) describes the use of implantation of nitrogen and subsequently RTA to cause atomic inter-diffusion near the active region at the facet. The basic mechanism is creation of defects by selective nitrogen implantation. Upon RTA, the defects assist in increased atomic inter-diffusion and cause the band-gap near the facet to increase (window laser). However, in this work the authors do not give details of implantation etc. The nitridation effect or rather the formation of dilute nitrogen containing alloy is not commented upon. Nevertheless, their procedure of nitrogen implantation and RTA, does show a band-gap increase of about 100 meV as seen from Photo-Luminescence (PL) measurements.

PROBLEM DESCRIPTION

After cleaving a laser wafer into laser bars to provide a laser facet surface on each side of the bar, conventional surface cleaning methods such as as Ar-ion milling often degrades the crystal quality near the surface. Energetic Ar-ions impinging on the surface layer sputters away the native oxide layer formed when cleaving in surrounding air, but causes damage to the crystal itself. Typically, is after such a procedure, a near-surface damage-layer remains. The nature of this residual damage includes newly created defects (interstitials, vacancies etc.), stoichiometric damage in crystals which are composed of two or more constituent elements (e.g. GaAs, etc) resulting from preferential removal of some elements compared to the others, and a rough surface morphology. This defective layer, particularly in localized areas, can absorb photons causing progressive (accelerated) local heating leading to COD.

The Ar-ion milling process could also heat the crystal and cause out-diffusion of material followed by decomposition of the crystal.

THE INVENTION

An object of the invention is to provide a facet passivation procedure, which is simple, cost-effective and at the same time gives a high yield by improved reproducibility.

Another object of the invention is to provide a facet preparation procedure that satisfies both requirements, the minimizing of light absorption and surface recombination.

Still another object of the invention is to provide a facet preparation procedure that at least partially satisfies the above requirements. Such a simplified preparation procedure could be good enough for some application ranges.

SOLUTION TO THE PROBLEM

The method according to the invention is to nitridise laser mirror facet of laser bars or laser chips during an etching process, such as milling with a gas comprising neutral nitrogen atoms or nitorgen ions in molecular and/or atomic form in a vacuum chamber. The facets of the laser bars were first cleaved in air, or some other ambient atmosphere. Introduction of a reactive gas like nitrogen in the etching process will certainly affect the crystal surface properties since it reacts with the crystal elements and creates a nitrided surface layer.

Thus, the etching process and the nitridisation may be performed with a plasma containing nitrogen ions, in molecular or atomic form, or neutral atomic nitrogen.

The essential concept behind this nitridisation is the formation of a nitride layer at the facet that (a) prevents chemical contamination (for example oxidation), (b) provides a higher band-gap surface layer, and (c) possibly also reduces the surface/interface carrier recombination velocity.

Hydrogen gas during ion milling of the laser facets (a) helps to clean the laser facet surface more effectively, especially the oxidized areas, since hydrogen is known to be effective in removing surface oxides, and (b) aids in the removal of group V elements in a III-V crystal making formation of group III-nitrides more favourable.

The nitrided surface layer so formed on the facet surface during nitrogen ion milling could be reinforced, particularly to even out surface interruptions and pin holes, if any, by subsequent deposition of an additional nitride film which may contain an element from the groups 2b, 3a, 4a and 5a such as any of the following elements: Al, Si, Ga, C, Ga, Zn.

A contamination free surface is created either (a) with, a surface nitrided layer so formed by nitrogen ion milling (with or without hydrogen), (b) with a surface nitrided layer so formed by nitrogen ion milling (with or without hydrogen) and an additional overlayer of deposited nitride film., or (c) with a mild nitrogen ion milling followed by nitridification by neutral atomic nitrogen.

Prior to mirror coating, the so-created contamination-free surface could be sealed by a passivation layer of such properties that non-radiative carrier recombination at the nitride-passivation layer-mirror coating interfaces is reduced to a minimum. Contrarily, direct deposition of mirror coating on the so-created contamination free surface may result in appreciable non-radiative carrier recombination via interface states at the nitride-mirror coating interface. (Passivation layers are often used in the prior art when the laser chips (bars) were cleaved in high vacuum and a specified passivation layer were usually deposited directly on the cleaved surface before the final mirror coating. Incidentally, the passivation layers are also used to change the reflectivity of the mirror coating. Passivation layers consisting of one or more of the following elements Zn, Se, S, Ga and N are typically reported.)

According to the invention a method of nitrogen ion-milling for laser facet preparation is promising:

(i) laser bars can be cleaved in air, (ii) ion-milling in vacuum removes the native oxide layer, and (iii) nitrogen (either ionic of atomic), if incorporated into the sample placed in the vacuum chamber, forms near-surface nitrided compounds which normally have band-gaps higher than their counter parts and can also prevent subsequent undesirable chemical contamination.

BRIEF DESCRIPTION OF THE DRAWINGS

For a more complete understanding of the present invention and for further objects and advantages thereof, reference is now made to the following description of examples of embodiments thereof—as shown in the accompanying drawings, in which:

FIGS. 1A–1D illustrates a first embodiment of a laser having the passivation layer according to the invention;

DETAILED DESCRIPTION OF EMBODIMENTS

Referring to FIG 1A, when manufacturing semiconductor lasers a wafer W of semiconductor diodes is produced, each diode having an n doped layer, a p doped layer and an active region in-between. For example the n-doped layer could comprise n-doped GaAs and the p-doped layer p-doped GaAs. The active region should preferably be un-doped, however, it might contain some doping species from the surrounding layers. Hence it is low-doped and could comprise a number of thin layers.

The active region could contain layers of AlGaAs and/or InGaAs and/or InGaAsP and/or InGaAs. As illustrated in FIGS. 1A and 1B, tis wafer could be divided into some smaller wafer parts WP, and each wafer part is scribed with scribe lines SL where cleaving should be made. As illustrated in FIG. 1C, the wafer part WP should then be cleaved into bars B along the scribe lines SL. The other side of the wafer is placed over an edge and is broken at each scribed line. In order to make laser chips of a bar a mirror facet is provided at each end of the cleaved section of the bar. As illustrated in FIG 1D, each bar is subsequently cleaved into chips CH. One of the mirror facets is high reflectivity (HR) coated and the other is anti reflective (AR) coated. The laser beam is emitted in the active region sideways in the active region of each semiconductor diode chip out through the anti reflective coated laser mirror. The manufacturing process briefly described above is usual.

The method according to the invention relates to the formation of the mirror facets. The laser bar WP is cleaved in air, or in some other ambient atmosphere, such as ordinary air, dry air, or dry nitrogen ambients, from the laser wafer or laser wafer part. Thereafter, the laser bar is placed in vacuum and is first ion-milled in order to reduce the surface contamination.

Figure 2:
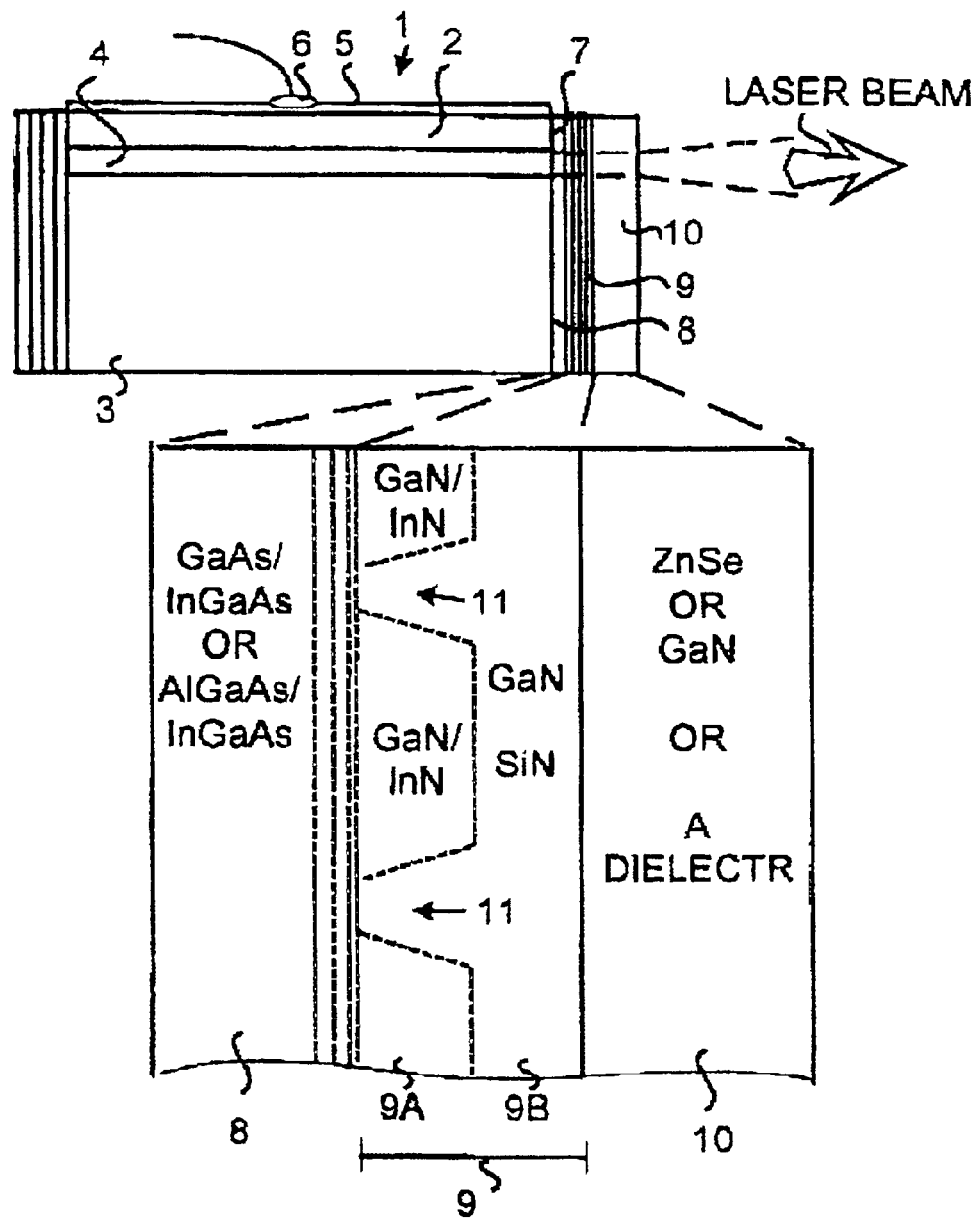
FIG. 2 illustrates providing passivation layers on a number of lasers.

A laser bar 1 shown in the embodiment in FIG. 2, comprises a p-doped layer 2, an n-doped layer 3, and an active region 4. A layer 5 of electrically conducting material is provided at the outer surface of the p-doped layer 2 having a bond wire 6 electrically connected to a controllable current supply. The laser is pumped at control of the current supply. The facet 7 to the right in FIG. 1 comprises a first layer 8 of GaAs/InGaAs or GaAs/AlGaAs provided at the cleaving, depending on the bar material.

Thus, the method according to the invention first makes a cleaving of the laser wafer into bars in air, or in some other surrounding atmosphere. Thereafter the bar is inserted in a vacuum chamber. Firstly the cleaved surface is to be cleaned. Therefore, a dry etching of the cleaved surfaces is started in the vacuum chamber, for instance ion beam etching, using a plasma of inert and/or reactive gases, such as nitrogen, hydrogen, argon, and chlorine gases, and mixtures of them. The addition of reactive gases such as halogen gases (e.g Cl, Br, or I based compounds) or hydrocarbon gases (e.g $CH_4$ and $C_2H_6$) to the dry etching step may help to assure that the surface is well defined, smooth and stoichiometric once the nitridation process step starts. This is so since the reactive gases promote removal of Ga to counter the preferential etching of As that occurs under physical etching i.e. ion milling.

The dry etching could thus comprise ion milling using argon plasma at the beginning. This is the preferred embodiment, since the argon plasma makes an effective milling procedure and is followed by a nitrogen milling. Further, the crystal structure, which is to have the contamination free surfaces at crystal mirror facets, may also consist of the following elements: Se and Sb.

Examples of other dry etching techniques which could be used for both the dry etching and nitridation steps are parallel plate reactive ion etching RIE), inductively coupled plasma reactive ion etching (ICP), electron cyclotron resonance plasma reactive ion etching (ECR), barrel reactor and downstream reactor. Other dry etching techniques well known to those skilled in the art (including those mentioned above) can also be used. The plasma excitation can for example be performed by supplying microwave electric power, radio frequency electric power or DC electric power.

Hydrogen gas during ion milling of the laser facets helps in some way to reduce the surface contamination and specially oxidized areas since hydrogen is known to react with oxides and remove the oxygen in the form of water. This procedure continues until a contamination free surface has been obtained. If an argon plasma has been used at the ion milling the laser mirror is passivated by adding nitrogen gas to the argon plasma and gradually remove argon until only nitrogen plasma is provided in a step like manner. Thus, the ion milling is completed with a nitrogen milling in order to obtain extremely flat surface morphology as a final plasma in the ion bean milling process.

Then, a native nitride layer, i.e. a nitride comprising the elements at the cleaved and contamination free surface, starts to grow during introduction of the nitrogen onto and in reaction with the AlGaAs/InGaAs or GaAs/InGaAs layers in this embodiment. Preferably, the interface between the cleaned facet and the nitride layer is preferably provided gradually making use of a native nitridisation such that no real abrupt interface layer exists. Since the border line between the AlGaAs—InGaAs or GaAs/InGaAs layers and the nitride layer is gradual, the interface recombination near the cleaved facet and the nitride layer will be low or absent.

However, the invention is not limited to a gradual interface, even if that is preferred. It could as well be abrupt. The milling could then be provided by only using nitrogen (either ionic or atomic) and probably with an addition of hydrogen. The important feature, however, is that a native nitride layer is provided, and hence not a nitride layer comprising other components than what is provided at the cleaved surface. Preferably, there is no interface between the different layers. This fact is illustrated by having dotted lines between the layers 8 and 9A, which is a first native nitridised layer comprising GaN/InN/AlN/AlGaN/InAsN. Since the concentration of incorporated nitrogen varies continuously into the crystal also for direct nitrogen ion milling, nitridation without any real abrupt interface layer may also be obtained by directly performing nitrogen ion milling, without any other dry etching prior to it or any other gases added to the nitrogen ion milling process.

Thus, the cleaved surfaces forming the laser mirror facets are native nitridised during the nitrogen-ion milling of the laser bars. The essential concept behind this is the formation of a nitride layer 9A at the facet that prevents chemical contamination (for example oxidation) and also provides a surface layer having a higher band-gap than the original facet surface itself and/or a layer that reduces the interface carrier recombination velocity.

The native nitride layer so formed on the surface during nitrogen assisted ion milling could be strengthened with at least one extra layer 9B of deposited nitride particularly in order to even out surface interruptions and possible pin holes in the first nitride film. This extra film or these extra films could comprise the same nitride but also nitrides other than the native one, for example SiN, GaN, etc are illustrated in FIG. 2.

A way to obtain extremely flat surface morphology is provided by using nitrogen as a final plasma in an ion beam milling process. Very smooth surfaces have been obtained on different semiconductor materials like GaAs, InP when using nitrogen in comparison to argon in the plasma. This was recognised in an earlier report by one of the inventors, Carsten Lindström, mentioned in the introduction part of the description where tie nitrogen plasma resulted in no change of the laser parameters by comparison with large parameter changes when using argon plasma and similar energies. However, in the mentioned report there were no suggestions that a nitride layer was formed only that a smoother surface was obtained. (In the particular report an addition of deposited silicon nitride was used directly to the cleaved and milled surface to protect the laser mirrors.)

The nitrogen ion milling provides at least one native nitride film 9A. At least one extra nitride film 9B is shown at the enlarged view of the facet layers below the laser 1. However, the facet layer films could be several comprising both native and other nitride films. Several film layers 9 are preferably provided since accidental pinholes 11 could be formed in each film layer. The combined film layers 9 function as a passivation layer. Each film layer in the passivation layer 9 could typically be 5 nm thick. However, the thickness could, vary and be both thinner and thicker that 5 nm. The native nitride so formed acts as a diffusion barrier of wafer composition constituents as well as a protective layer from foreign contaminants. An additional layer of ZnSe or GaN or similar material could be formed at the front surface acting as additional passivation layer of the front facet, since the interface non-radiative recombination then is suppressed.

The back facet of the laser bar must be highly reflective, about 95% reflectivity. Also this back facet is provided with a passivation layer in the same manner as described above after cleaving and is then coated with a high-reflection layer.

Figure 3:
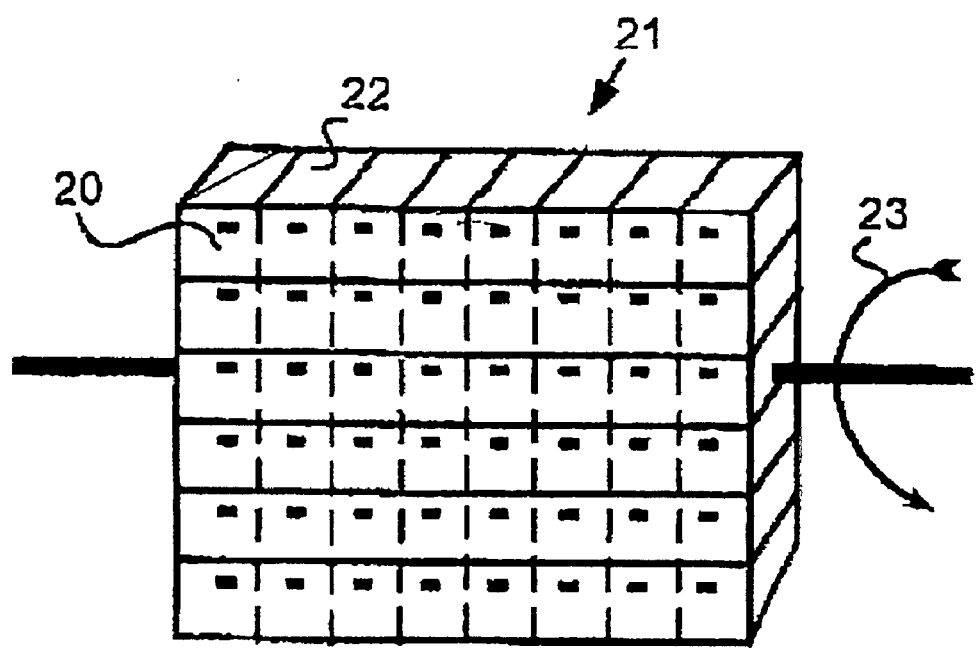
FIG. 3 illustrates a second embodiment of a laser having the passivation layer according to the invention.

FIG. 3 illustrates that a large number of diode laser bars 20 could be laid one above the other in a combined stack 2D-matrix 21 in order to treat them simultaneously. The laser chips 22 to be cleaved from the laser bars later on are illustrated by dashed lines. The combined stack 2D-matrix 21 makes it possible to passivate the whole matrix of laser bars in only two steps, i.e. the rear and front facets of the bars. The rotation of the matrix between providing the front facets and the rear facets is illustrated by the curved arrow 23.

The 2D-matrix process brings about that the uniformity from laser chip to laser chip will be very high. A high yield is provided since there are no critical alignment processes involved at the manufacturing. Since the cleaving of the bars from the wafer or wafer part is made in air it is possible to cleave extremely short laser bar chips down to 200 $\mu$m, which is suitable for un-cooled pumped lasers due to low power consumption.

It is preferred to cleave the bars one by one from the same wafer or wafer part and then place them in the matrix. The cleaving cut will then be quite predictable, and the surface of the cleaved facet will contain contaminants.

The stacked laser combination could have the following manufacturing steps:

1. Cleave bars in normal air or dry air or dry nitrogen ambient. The cleaved and exposed surface of the bar is referred to as the object. The object is a part of a crystal and consists typically of elements such as Ga, Al, In, P, C and As.
2. Stack the cleaved bars in a 2-dimensional (2D) matrix so that the objects can be subjected to further processing steps.
3. Place the matrix of cleaved bars in vacuum. A useful vacuum is between 10 Torr to $10^{-11}$ Torr, preferably less than $10^{-7}$ Torr. However, the vacuum could be as low as 10 and as high as can be provided.
4. If the objects had been cleaved in a dry nitrogen ambient, the objects may be retained under similar ambient until they are transferred to a vacuum chamber.
5. Remove surface oxide and contamination on the objects using dry etching, for instance ion beam etching, using a plasma of inert and/or reactive gases, such as nitrogen, hydrogen, argon, halogen (e.g. Cl, Br, or 1 based compounds) and hydrocarbon gases (e.g. $CH_4$ and $C_2H_6$) and chlorine gases and mixtures of them.
6. Smooth surface morphology of the objects will be enhanced by operating in a specific energy ion energy range from 1 to 1000 eV, preferably between 50 to 500 eV.
7. Smooth surface morphology of the objects will also be enhanced by varying the incident beam angles from 0° to 85° from an angle normal to the surface of the object. In addition, ion-channelling can also be reduced, thereby suppressing defect generation deeper in the sample.
8. Creation of a nitride surface layer on the objects using a nitrogen ion beam or thermal nitrogen atoms extracted from a plasma containing nitrogen, the nitrogen ions being accelerated from the plasma to the surface (e.g. extracted as an ion beam), or a gaseous form of a nitrogen containing chemical compounds, for example ammonia. The nitrided layer will comprise at least one of the following materials: AlN, GaN, InN, InAsN. In addition, the plasma may also contain hydrogen and/or argon, in which case the object will also be subjected to the extracted Ar and H ions with an extracted beam.
9. Forming nitrided layer, the nitride layer consisting of at least one of the elements N, Al, In, Ga, As, C and P, preferably consisting of predominantly nitrogen bonded to group III elements.
10. Additional insitu or exsitu deposition of thin nitride film using reactive plasma in combination with nitrogen and at least one element from the periodic table groups 2b, 3a, 4a, and 5a, such as C, Si, Ga, Zn, and Al.
11. Addition of at least one thin passivation layer film to further reduce interface/surface non-radiative recombination prior to mirror coating.
12. Any or all the steps comprising nitridation and depositions, i.e. steps 7 to 10, could be combined with a thermal annealing procedure.
13. Addition of a protective layer and/or a mirror coating, such as anti reflection coating for the front mirror and high-reflection coating for the back mirror.

The dry etching and first nitridation step could comprise forming the gas into plasma by supplying microwave electric power, radio frequency electric power, or DC electric power to the gas.

Moreover, since a contamination free surface has been created with a one/two layer nitride of different compositions to seal it, a passivation layer of such properties has been able to be introduced that the interface carrier recombinations at the nitride-passivation layer-mirror coating are reduced to a minimum.

Figure 4:
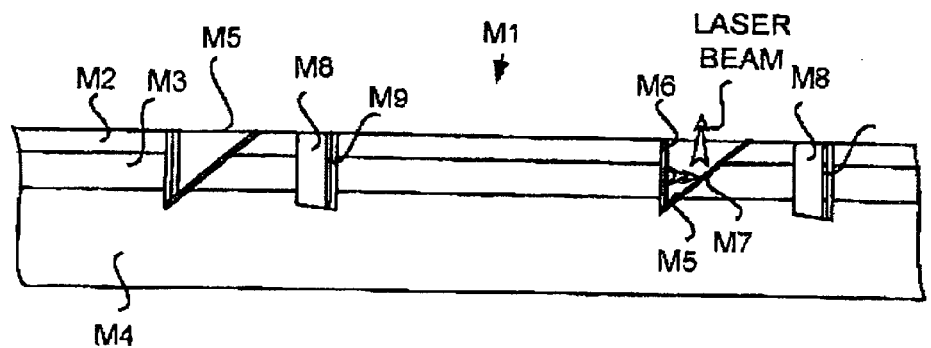
FIG. 4 illustrates an embodiment of an application, in which the laser according to the invention is used.

A second embodiment of a laser provided with the laser mirrors according to the invention is illustrated in FIG. 4. Each whole laser chip is etched at the front side of a wafer. A whole laser is shown in the middle. A part of a laser is shown on each side of it in order to illustrate that the lasers are provided one after the other in a string on the wafer. It is also to be noted that the wafer contains a number of such laser strings in die direction perpendicular to the plane of die paper.

A laser wafer M1 having a p-doped layer M2, an active region M3, and an n-doped layer M4 has some groves M5, Each of them have a triangular form having one side M6 normal to the wafer turned to the active region M3 in order to function as the front facet of a laser bar and a side M7 45° to the normal cut M6. The grove M6 is a laser front facet for the laser beam in the active region M3 and has been dry etched and treated in the same way as described above for the laser bar facets The grove M7 represents a tilted mirror turning the laser beam LB perpendicular to the surface of the wafer. This cut is thus smoothed and provided with a high reflective surface overlay.

A second kind of grove M8 is provided having at least one side M9 turned towards the active region M3 normal to the surface of the wafer. This side is intended to function as the back mirror facet of a laser bar. It is thus dry etched treated in the sane way as described above. It is to be noted that the passivation layer treatment for both the back and front facet mirrors can be provided simultaneously in this embodiment. The whole surface turned upwards in FIG. 4 could be treated in the same way as the mirrors, such that the whole surface is dry etched and provided with a native nitride layer. However, the antireflective layer of the facet M6 and the high reflective layer of the facet M9 in each laser bar are provided while shielding the other parts of the surface. Also the highly reflective mirror M7 is provided with its reflective layer while the rest of the surface is shielded.

EXAMPLE OF FIELD OF APPLICATION

Wavelength Division Multiplexing

Wavelength Division Multiplexing (WDM) is a technique to squeeze data into an optical fiber.

Optical fibers have been installed since the eighties to handle long-haul traffic between cities and countries. The fiber itself costs less than 10 cents per meter. The largest cost is to install the fiber, either underground or at the bottom of the sea. When available, one can attach the fiber to power lines for cheaper installation costs. After roughly 100 km the signal is attenuated 20 dB (1% of its original strength) and has to go through a repeater, which regenerates, re-times and reshapes the signal to its original strength and shape. A repeater costs about $100000. However, since Internet started to be deployed widely in 1995, the Internet traffic increases about 100% every year. Since 1998 the dominating traffic is Internet.

One way to handle this rapid growth is to add more channels into the fiber at different wavelengths using WDM technology. Every wavelength usually handles 2.5 Gigabit/second (40 000 simultaneous telephone conversations). Today, WDM systems can have up to 80 wavelength channels (>3 million telephone conversations at 64 kb/s). The traditional repeater only handles one wavelength. Today, one uses EDFAs (EDFA=Erbium Doped Fiber Amplifier) to simultaneously amplify up to 80 or 160 wavelength channels. The cost of an EDFA is approximately the same as a traditional repeater, hence there are enormous cost savings both in the number of repeaters and the number of installed optical fibers. This is why long distance calls are quite cheap nowadays (e.g. <1 SEK/minute from Sweden to USA).

The EDFA consists of a silica fiber doped with Erbium in the core. The Erbium ions are energized by a pump laser. The preferred pump wavelength is 980 nm since the noise of the amplifier is minimized at that wavelength. 30% of the costs of an EDFA come from the pump laser. Hence, every improvement in the performance cost ratio for the pump laser will have a strong impact on EDFAs and the WDM network in general. The deployment of EDFA in city rings, so called Metropolitan area networks, has been hampered by the large cost and the high power consumption of the 980 nm pump laser technology.

However, the disruptive technology of a pump laser according to the invention having the new passivation technology described above will reduce cooling requirements of the laser chips and hence reduce packaging costs and overall power consumption. The process has also high throughput, which will reduce costs.

Figure 5:
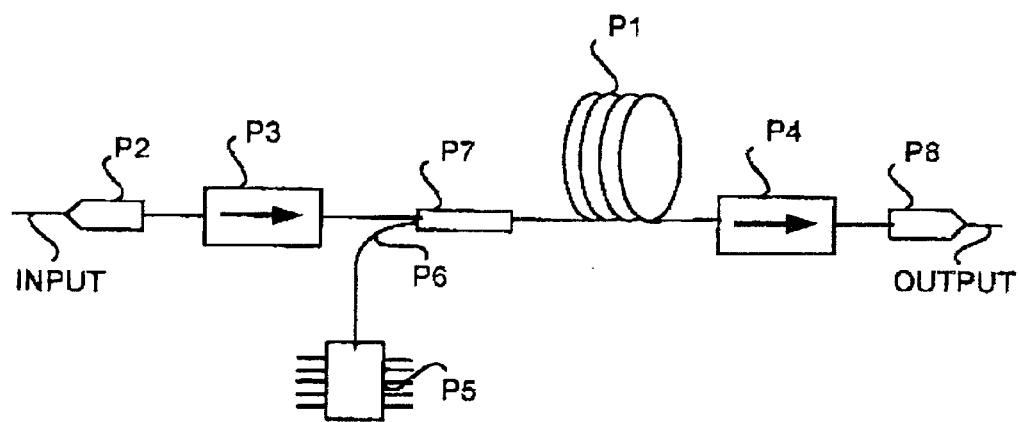
FIG. 5 illustrates an embodiment of the application, in which the signal to be transmitted through an optical fiber P1.

As illustrated in FIG. 5, the signal to be transmitted through an optical fiber P1 enters through a fiber contact P2. The signal has to have a wavelength between 1530 . . . 1560 nm to fall within the gain bandwidth of the erbium ions. There are usually optical isolators P3 and P4 at the input and the output, respectively, of the EDFA to prevent multiple reflections and hence noise. A pump laser P5 is connected to a fiber P6 connected to an input of a WDM, to which also the input signal is fed to another input. The reshaped signal is output through an output contact P7.

The WDM combines the pump laser light (980 nm) with the signal (1530 . . . 1560 nm). The pump laser energy is transferred to the signal band through absorption of the erbium ions and subsequently by stimulated emission at the signal band. The gain is usually 20 dB. The output power is proportional to the pump power. The useful signal band is more than 3 Tb/s (~60 million simultaneous telephone conversations).

Thus, fields of application for pump lasers based on GaAs are above all Erbium (Er) doped fiber amplifiers, but also Thulium (Tm) doped fibers. Thulium-doped fibers give amplification in the so-called S-band, which is important for optical communication. The S-band extends between 1450 to 1480 nm. Amplification can be provided by means of Thulium-doped Fluoride fibers or alternatively by Raman-amplifiers pumped at ca 1350 nm. However, fluoride fibers are hard to work with. They can not be fusion spliced towards standard kinds of fibers. They are also hygroscopic, i.e. they degrade fast due to damp and heat. They are also brittle.

Thus, important wavelengths are 970 to 985 nm (EDFA=Erbium Doped Fiber Amplifier), 1045 to 1070 nm (TDFFA=Thulium Doped Fluoride Fiber Amplifier), and 915 and 970 nm (EDWA=Erbium Doped Wave-guide Amplifier).

The most interesting wavelengths are 1045 to 1070 nm. Unfortunately, a power on nearly 300 mW is needed for reaching an amplification of 20 dB.

Er/Yb-doped EDWA (Erbium Doped Wave-guide Amplifier) is also an important application. These kinds of wave-guides are manufactured in glass. Since they are short the erbium has to be made more sensitive. Yttrium is user for that purpose. Usually there is ten times more Yttrium than Erbium. Thereby an effective absorption of the pump is possible. A co-doping with P is often done in order to optimize the transition from Yttrium to Erbium.

What is claimed is:

1. A method for providing an improved surface of a III-V semiconductor at crystal mirror facets for laser cavities, comprising:

providing a wafer comprising a layer of III-V semiconductor material; in an ambient atmosphere cleaving the wafer to produce an array with at least one laser emitter having at least one crystal mirror facet, wherein cleaving the wafer leaves reactive atoms at a site of cleavage;

removing oxides and other surface contaminants formed with the reactive atoms from the at least one crystal mirror facet by controllably delivering nitrogen ions with an ion beam in a vacuum;

during the step of removing oxides, forming first nitrides with the reactive atoms on the at least one crystal mirror facet;

wherein the first nitrides comprise native nitride compounds, each native nitride compound including at least one group III element and nitrogen; and wherein a majoring of nitrogen in the native nitride compounds first nitrides is suplied by controllable delivering of nitrogen with a nitrogen ion beam, wherein the nitrogen ion beam is operated in an energy ion energy range from 1 to 1000 eV.

2. The method of claim 1, wherein the native nitride compounds are selected from the group consisting of GaN, InN, Al N, AlGaN, InGaN, InAlGaN, GaAsN, InAsN, AlAsN, InGaAsN, AlGaAsN, InAlGaAsN, GaPN, InPN, AlPN, InGaPN, AlGaPN, AlInPN, and AlInGaPN.

3. The method of claim 1, wherein said all other atoms in the native nitride compounds were present in the layer of III-V semiconductor material prior to the cleaving step.

4. The method of claim 1, wherein the nitrogen ion beam comprises nitrogen in atomic form.

5. The method of claim 1, wherein the nitrogen ion beam comprises nitrogen in molecular form.

6. The method of claim 1, wherein the at least one crystal mirror facet comprises GaAlAs-InGaAs surfaces which further comprises at least one of Sb and Se.

7. The method of claim 1, comprising the further step of adding at least one film that reduces interface recombination prior to mirror coating.

8. The method of claim 1, wherein forming the first nitrides with the reactive atoms creates a chemically non reactive surface.

9. The method of claim 1, wherein forming the first nitrides with the reactive atoms reduces chemical contamination of the crystal laser facet.

10. The method of claim 1, wherein forming the first nitrides with the reactive atoms reduces oxidation of the crystal laser facet.

11. The method of claim 1, wherein forming the first nitrides with the reactive atoms prevents oxidation of the crystal laser facet.

12. The method of claim 1, wherein forming the first nitrides with the reactive atoms creates a surface having a higher band-gap than that of an original crystal laser facet surface.

13. The method of claim 1, wherein the first nitrides formed with the reactive atoms creates a surface having a reduced interface carrier recombination velocity.

14. The method of claim 1, wherein the first nitrides formed with the reactive atoms act as a diffusion barrier.

15. The method of claim 1, wherein the removing step and formation of first nitrides from the reactive atoms create a smoother surface at crystal mirror facets for laser cavities.

16. The method of claim 1, wherein the nitrogen beam is directed to the site of cleavage by varying the incident beam angles from 0 degree to 90 degree from an angle normal to the site of cleavage.

17. The method of claim 1, wherein the nitrogen beam is directed to the site of cleavage with reduced ion channeling.

18. The method of claim 1, comprising the further step of forming a dielectric mirror layer on the first nitrides formed with the reactive atoms.

19. The method of claim 1, comprising the further step of adding at least one or more nitrides on the first nitrides.

20. The method of claim 19, wherein the at least one or more nitrides even out surface interruptions of the first nitrides formed with the reactive atoms.

21. The method of claim 19, further step of forming a dielectric mirror layer on the one or more nitrides that are formed on the one or more nitrides first nitrides which formed with the reactive atoms.

22. The method of claim 1, wherein the removing step includes at least one substance from the group consisting of hydrogen, noble gases, halogen compounds, ammonia and hydrocarbon gases.

23. The method of claim 22, wherein the controllable delivering of nitrogen with a nitrogen ion beam uses a mixture of nitrogen and another gas, and the other gas is gradually replaced by nitrogen until only the nitrogen beam remains.

24. The method of claim 23, wherein the another gas is a noble gas.

25. The method of claim 22, wherein the removing step is performed with an ion beam using a gas that is free of nitrogen, and wherein during the removing step, the gas that is free of nitrogen is gradually replaced by nitrogen until only nitrogen remains.

* * * * *